(12) United States Patent
Huelss

(10) Patent No.: US 7,085,338 B2
(45) Date of Patent: Aug. 1, 2006

(54) LOW POWER, HIGH ACCURACY LITHIUM BATTERY PROTECTION CIRCUIT

(75) Inventor: Rolf Huelss, Hockenheim (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 848 days.

(21) Appl. No.: 09/999,342

(22) Filed: Dec. 3, 2001

(65) Prior Publication Data

US 2003/0080747 A1 May 1, 2003

(30) Foreign Application Priority Data

Oct. 29, 2001 (EP) ................................. 01640006

(51) Int. Cl.
*H04L 7/00* (2006.01)
(52) U.S. Cl. ...................... 375/355; 320/137
(58) Field of Classification Search ............... 375/350, 375/346, 355, 316, 354, 377; 455/573, 73, 455/572, 550.1; 307/10.7, 10.1, 9.1, 311, 307/310; 320/166, 127, 134–137; 370/311, 370/310
See application file for complete search history.

(56) References Cited

U.S. PATENT DOCUMENTS

| | | | | |
|---|---|---|---|---|
| 4,205,203 A * | 5/1980 | Mehta et al. ................ | 370/525 |
| 5,539,299 A | 7/1996 | Fernandez et al. ............. | 320/39 |
| 5,625,580 A * | 4/1997 | Read et al. .................... | 703/21 |
| 5,631,537 A | 5/1997 | Armstrong .................... | 320/15 |
| 5,650,571 A * | 7/1997 | Freud et al. .............. | 73/861.06 |
| 5,764,033 A | 6/1998 | Tamai ......................... | 320/132 |
| 5,894,212 A | 4/1999 | Balogh ........................ | 320/122 |
| 5,916,237 A * | 6/1999 | Schu ............................. | 607/2 |
| 5,982,149 A | 11/1999 | Shih ............................ | 320/134 |
| 6,064,695 A * | 5/2000 | Raphaeli ..................... | 375/230 |
| 6,157,165 A * | 12/2000 | Kinoshita et al. ........... | 320/116 |
| 6,157,171 A | 12/2000 | Smith ......................... | 320/133 |
| 6,603,419 B1 * | 8/2003 | Nanba et al. ................ | 341/155 |
| 6,881,514 B1 * | 4/2005 | Ahn et al. .................... | 429/99 |

FOREIGN PATENT DOCUMENTS

FR EPX 790691 A1 8/1997

* cited by examiner

*Primary Examiner*—Pankaj Kumar
(74) *Attorney, Agent, or Firm*—Saile Ackerman LLC; Stephen B. Ackerman

(57) ABSTRACT

A method for measuring and filtering analog signals in a battery protection algorithm is achieved. A clock signal having a fixed period is generated. Analog signals are sampled to create sampled digital signals. The sampling is synchronized with the clock signal. The analog signals are sampled such that no two analog signals are sampled during a single fixed period. The sampled digital signals are filtered such that stored versions of the sampled digital signals are updated whenever the sampled digital signals transition to new states and remain in these new states for a defined number of the samplings. A circuit for measuring and filtering analog signals is in a battery protection circuit is also achieved. Sampling circuits are placed into standby mode when not sampling.

17 Claims, 3 Drawing Sheets

LOW POWER, HIGH ACCURACY LITHIUM BATTERY PROTECTION CIRCUIT

BACKGROUND OF THE INVENTION (1) Field of the Invention

The invention relates to a battery protection circuit, and more particularly, to a battery protection circuit having a method for measuring and filtering analog signals.

(2) Description of the Prior Art

Rechargeable batteries have gained wide acceptance and usage as power sources for portable appliances. Mobile communications devices, entertainment devices, and video devices are just a few of the many appliances now using rechargeable battery technology. An important feature of these devices is the circuitry that controls the charging and discharging of the battery. Over charging and over discharging of the battery cells can reduce the lifetime, or the performance or even destroy the battery.

To prevent over charging and over discharging, the battery control circuit must measure the charging current (CC), the charging voltage (CV), the discharging current (DC), and the discharging voltage (DV). The signals are analog in nature, and typically exhibit transient responses and noise. Therefore, it is necessary for the control circuit to measure and to filter these current and voltage signals to obtain values that can be used in the control circuit for deciding when to open and close the controlling switches.

In the current art, there are two techniques for measurement and filtering. In the first technique, a timebase is derived external to the control integrated circuit using a resistor-capacitor (RC) charge-discharge time constant circuit. This approach has the advantage a relatively low current consumption. Unfortunately, the external components are expensive to manufacture and assemble. The second technique uses an internally generated timebase to reduce cost. However, this internal timebase uses a considerable amount of power. It would be advantageous to perform the measurement and filtering function using an internal timebase with significantly lowered power consumption.

Several prior art inventions describe battery protection circuits. U.S. Pat. No. 5,764,033 to Tamai discloses a battery protection circuit to prevent over charging. U.S. Pat. No. 5,982,149 to Shih describes a mobile phone battery charger. U.S. Pat. No. 5,894,212 to Balogh teaches a discharge protection system for a multi-cell battery. A microprocessor is used to control sampling of cell voltages at a fast sample rate. U.S. Pat. No. 5,539,299 to Fernandez et al describes a protection switch for a battery pack.

SUMMARY OF THE INVENTION

A principal object of the present invention is to provide an effective and very manufacturable method and circuit for measuring and filtering analog signals in a battery protection algorithm.

A further object of the present invention is to provide a measuring and filtering method and circuit with reduced current consumption.

A still further object of the present invention is to reduce current consumption by generating a sampling clock with a relatively slow period.

Another still further object of the present invention is to reduce current consumption by de-synchronizing the sampling of analog signals such that no two signals are sampled during the same clock period.

Another still further object of the present invention is to reduce current consumption by putting the analog-to-digital sampling circuits into standby mode when not sampling.

Another further object of the present invention is to reduce cost by integrating the clock generator on-chip.

Another still further object of the present invention is to achieve tight sampling and filtering error specifications using a relatively slow clock period by trimming or adjusting the sampling clock period during testing.

In accordance with the objects of this invention, a method for measuring and filtering analog signals in a battery protection algorithm is achieved. A clock signal having a fixed period is generated. Analog signals are sampled to create sampled digital signals. The sampling is synchronized with the clock signal. The analog signals are sampled such that no two analog signals are sampled during a single fixed period. The sampled digital signals are filtered such that stored versions of the sampled digital signals are updated whenever the sampled digital signals transition to new states and remain in these new states for a defined number of the samplings.

Also in accordance with the objects of this invention, a battery protection measurement and filtering circuit is achieved. The circuit comprises, first, a clock signal generator. The clock signal has a fixed period. A sampling circuit for sampling analog signals to create sampled digital signals is included. The sampling is synchronized with the clock signal. The analog signals are sampled such that no two analog signals are sampled during a single fixed period of the clock signal. Finally, a digital filter is used for filtering the sampled digital signals The stored versions of the sampled digital signals are updated whenever the sampled digital signals transition to new states and remain in these new states for a defined number of samples.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose a novel method and circuit for measuring and filtering analog signals in a battery protection circuit. A relatively slow internal sampling clock period can be used for sampling and digital filtering. This reduces current consumption. Further, the sampling algorithm de-synchronizes sampling of various signals to reduce current consumption. It should be clear to those experienced in the art that the present invention can be applied and extended without deviating from the scope of the present invention.

Figure 1:
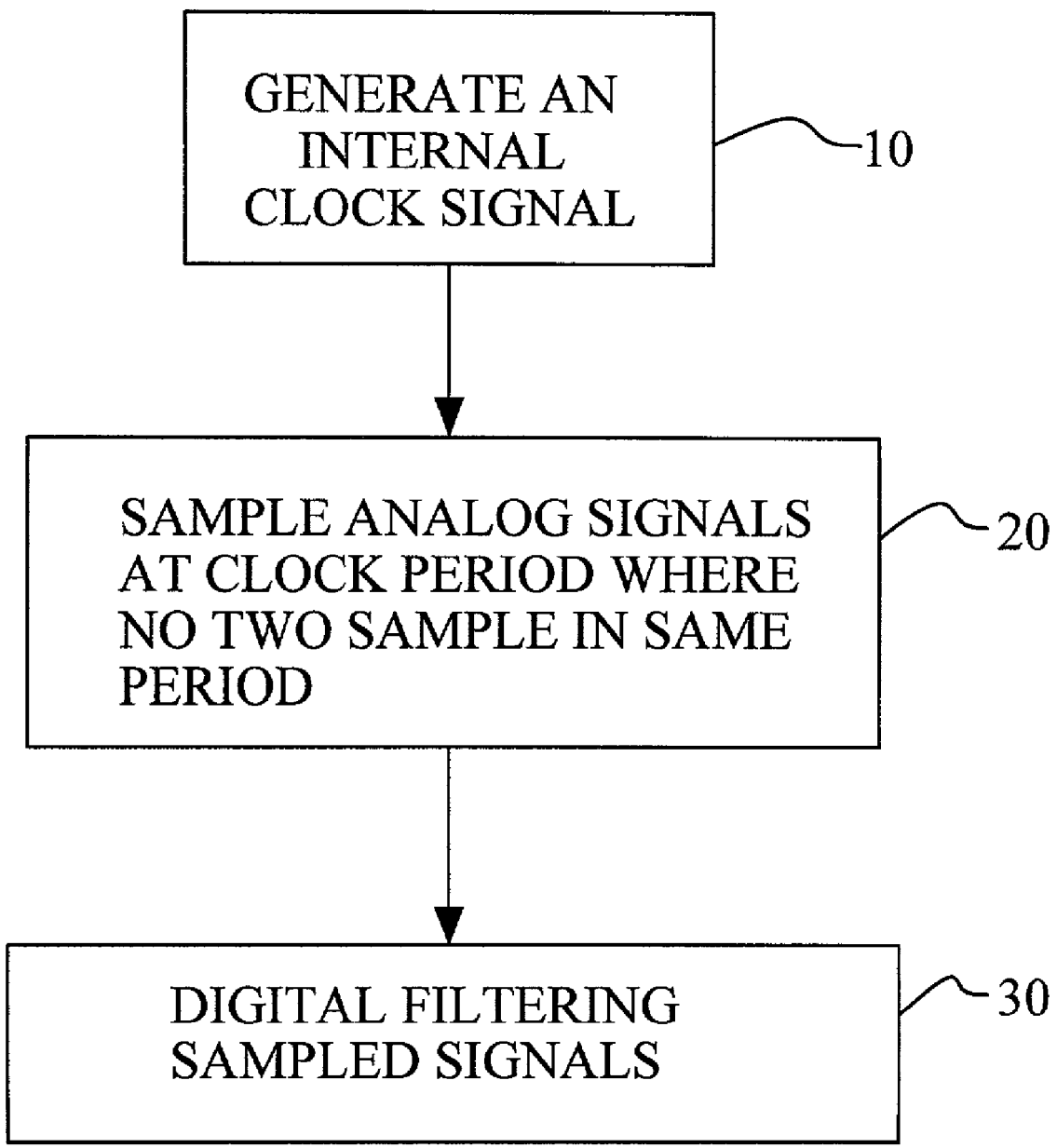
FIG. 1 illustrates the preferred embodiment of the method of the present invention.

Referring now to FIG. 1, the preferred embodiment of the method of the present invention is illustrated. An internal sampling clock signal is generated in step 10. The sampling clock must have a fixed period and preferably exhibits excellent stability. It is desirable that the sample clock period be as large, or the frequency as small, as possible to minimize power consumption due to switching. The analog signals are then sampled at the clock period in step 20. While the sampling of the various signals is synchronized to clock period, it is important to note that each signal is sampled at a different clock period cycle. That is, no two signals are sampled during the same cycle of the clock period. This de-synchronization of the sampling further reduces the current consumption because only one analog-to-digital sensing circuit is activated. In addition, when not sampling, the analog sampling circuit is de-activated or put into a low-current, standby mode to reduce current consumption. The sampled signals are then digitally filtered using the sample clock in step 30. In the digital filter, the stored versions of the sampled signals only change states when the sampled signals change states and remain in these changed states for the defined filtering time.

The values and accuracy's of the required filtering delays for the analog signals, such as charging current (CC), charging voltage (CV), discharging current (DC), and discharging voltage (DV), must be analyzed to determine the minimum clock period possible. It is found that the error of the digital filtering delay of each signal comprises three parts: the frequency of the sample clock, the sampling rate for the particular signal, and the number of samples for state-switching the signal (the filter delay). For each required signal, such as CC, CV, DC, and DV, the sample rate and number of samples have to be defined independently. The goal of the analysis is to find the longest time period sampling clock (or smallest frequency) that will meet the filtering and error requirements. Further, the sampling positions of each signal are de-synchronized to reduce current consumption.

For example, the specified sampling and filter constraints for a preferred battery protection algorithm are shown in Table 1 below.

TABLE 1

Specified Values for Sampling and Filtering.

| Item | DV | CV | DC | CC |
|---|---|---|---|---|
| Specified filtering delay | 50 ms | 2000 ms | 10 ms | 10 ms |
| Specified accuracy of filter | 50% | 50% | 50% | 50% |
| Oscillator frequency error | 40% | 40% | 40% | 40% |
| Number of samples | 8 | 8 | 8 | 8 |
| Maximum sampling error | 6.7% | 6.7% | 6.7% | 6.7% |
| Required typical sampling frequency | 183.3 Hz | 4.6 Hz | 916.7 Hz | 916.7 Hz |
| Typical filter delay (calculated) | 40.9 ms | 1636.4 ms | 8.2 ms | 8.2 ms |
| Maximum error of specified delay | 45.5% | 45.5% | 45.5% | 45.5% |

In this example, the filtering delay for each of the signals is specified. The DV filter delay is 50 millisec. The CV filtering delay is 2000 milliseconds. Both the DC and the CC filtering delays are 10 milliseconds. The filter accuracy is specified at 50%. The sample clock oscillator has a specified frequency error of as much as 40%. Each filter is specified to switch states at eight samples. The maximum sampling error is specified as 6.7%. To achieve these specifications, the required sampling frequency is 183.3 Hz for DV, 4.6 Hz for CV, and 916.7 Hz for both DC and CC. Using these values, the maximum error of the specified delay is 45.5% for each signal.

Depending on the calculation results of Table 1, a sampling clock oscillator frequency and single sampling frequencies may be chosen as shown in Table 2 below.

TABLE 2

Selected Oscillator Frequency and Sampling Frequencies for Sampling and Filtering.

| Item | DV | CV | DC | CC |
|---|---|---|---|---|
| Typical Oscillator Frequency | 3680 Hz | 3680 Hz | 3680 Hz | 3680 Hz |
| Defined Dividing Factor | 20 | 800 | 4 | 4 |
| Typical Sampling Frequency | 184.0 Hz | 4.6 Hz | 920 Hz | 920 Hz |
| Typical Filter Delay | 40.8 ms | 1630.4 ms | 8.2 ms | 8.2 ms |
| Maximum Positive Delay Error | 44.9% | 44.9% | 44.9% | 44.9% |
| Maximum Negative Delay Error | −45.7% | −45.7% | −45.7% | −45.7% |

An oscillator frequency of 3680 Hz is chosen. This relatively low frequency facilitates low current consumption due to switching while meeting the requirements for sampling frequency and digital filter error. The defined dividing factor for DV is chosen as 20, for CV is chosen as 800, and for DC and CC is chosen for 4. Using the selected divisors and the selected frequency, the typical sampling frequencies are 184 Hz, 4.6 Hz, and 920 Hz for DV, CV, and DC/CC respectively. This corresponds to typical filter delays that are very close to the calculated values of Table 1. Finally, the selected sampling frequency has maximum positive delay error and negative delay error that are below the specified maximums.

Figure 2:
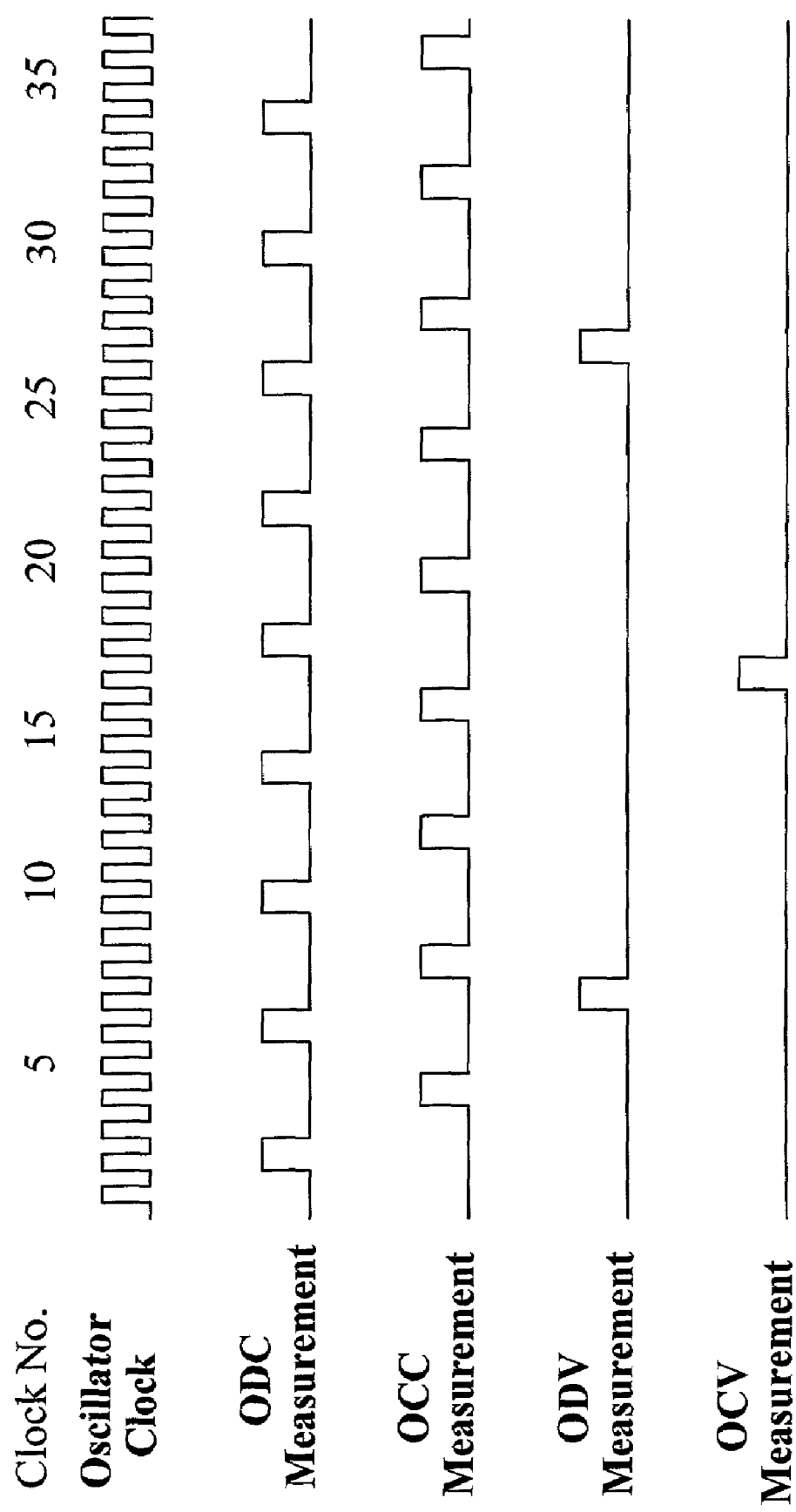
FIG. 2 illustrates the synchronization and de-synchronization of sampling measurements used in the present invention to reduce current consumption.

Referring now to FIG. 2, the synchronization and de-synchronization of sampling measurements used in the present invention to reduce current consumption are shown. The oscillator clock, or sample clock, has a fixed time period as shown. The cycle number for the oscillator clock is shown. Measurement pulses are derived from the oscillator clock as detailed in Table 2 such that each measurement pulse is synchronized with the sample clock. It can be seen that the over discharge current (ODC) and the over charge current (OCC) have the same sampling rate and that this rate is faster than the sampling rate for the over discharge voltage (ODV). Further, the over charge voltage (OCV) rate is the slowest. It is important to note that, while the ODC and OCC sample rates are the same, the sample pulse are offset, or de-synchronized, such that ODC and OCC are sampled on different cycles. Further, the method insures that all of the sampling is de-synchronized, one from another, to reduce peak current consumption.

Figure 3:
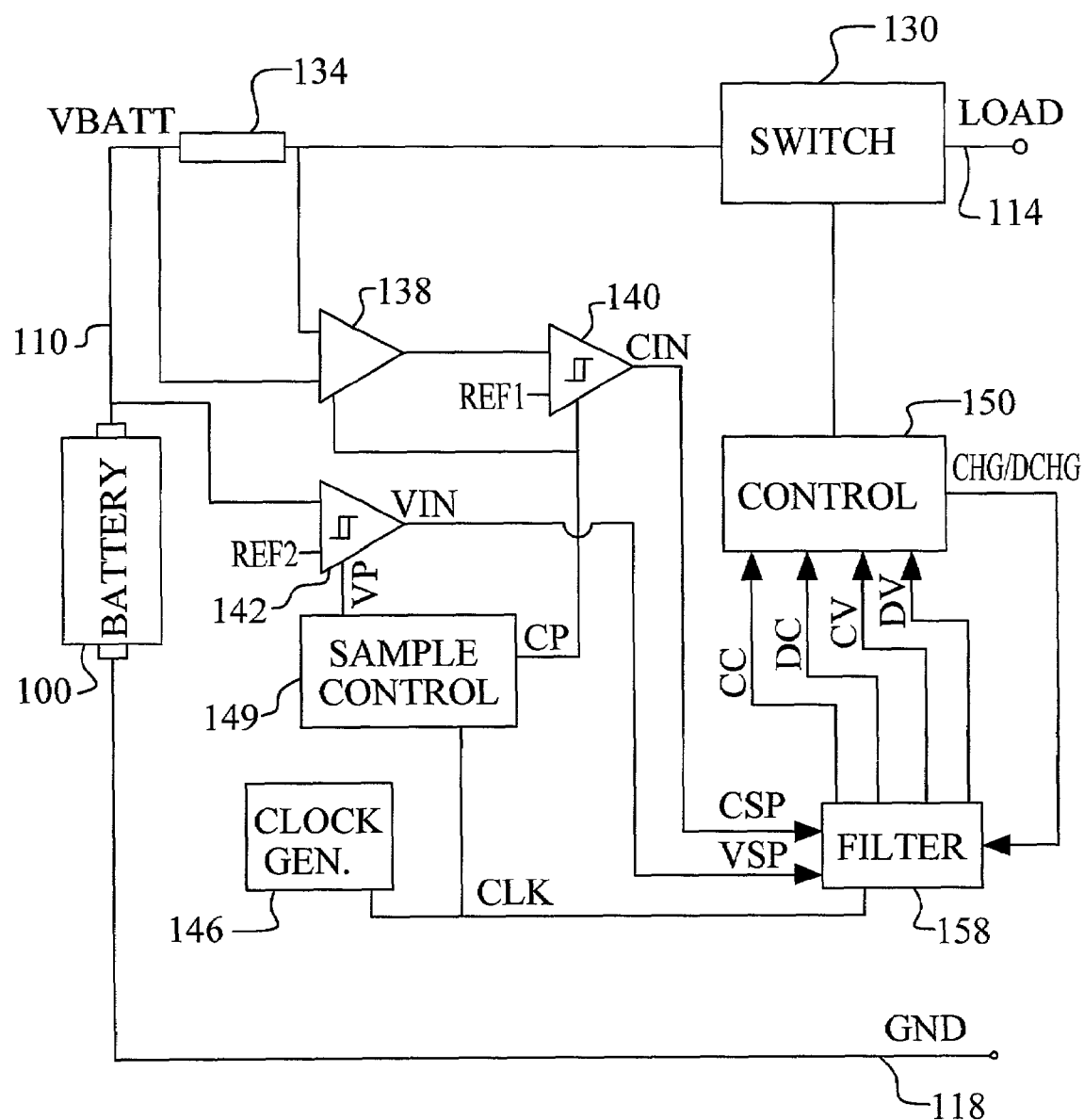
FIG. 3 illustrates the preferred embodiment of the circuit of the present invention.

Referring now to FIG. 3, the preferred embodiment of the circuit of the present invention is shown. A battery protection circuit is shown. The battery 100 comprises a rechargeable battery and, more preferably, a lithium ion (Li$^+$) rechargeable battery. A control circuit 150 monitors the operating conditions of the battery and controls current flow by the switch block 130. A load, such as a mobile phone, or a charging source may be coupled between the output LOAD 114 and GND 118. A sensing resistor 134 may be used, for example, in series between the positive terminal VBATT 110 of the battery 100 and the switch block 130 to convert the current flow into a small voltage drop. Other methods could be used for creating current signals for monitoring by the control circuit 150.

A clock generator block 146 is used to create the low frequency, on-chip sample clock CLK. The clock generator preferably comprises a bias current charging an on-chip capacitor. The sample clock has a period or frequency corresponding to the value selected as in Table 2. The sample clock preferable comprises a fixed period of between 100 microseconds and 10 milliseconds to minimize current consumption. The sample clock CLK is used by the sample block 149 and the digital filter 158 for sampling and filtering the current and voltage signals. To improve accuracy, the clock generator 146 may be implemented such that the running frequency is trimmable during testing using, for example, a laser trim of a resistor value or a ROM setting.

The current signals CC and DC are derived by measuring the battery current flow. If the sense resistor 134 is used, then the differential voltage across this resistor must first be measured and buffered into a common-mode voltage using a differential amplifier 138. The common-mode voltage is then compared at comparitor 140 to a reference REF1 that may comprise different references for CC and DC. Further, while the embodiment shows a single amplifier 138 and comparitor 140 for both CC and DC measurement, in fact, several device paths may be used. The sampled current signal, CSP, will have one of two states. When the measured current (converted to a voltage) is below the REF1 level, then CSP will be in the normal operating state. When the current is very large, the converted voltage may exceed the REF1 level and cause CSP to enter the over current state.

The voltage signals CV and DV are converted from the analog domain to the digital domain in a similar way. The battery voltage VBATT 110 is coupled to one input of the comparitor 142 while the other input is coupled to REF2. Again, while a single comparitor is shown for both CV and DV measurement, in fact several may be used. The VSP signal is high or low depending on the voltage level of the battery when compared to the reference value REF2.

As an important feature of the invention is that the sampling circuits 138, 140, and 142, used for converting the analog signals to digital signals, are controlled by the sampling control block 149. As discussed above, the signal sampling must be de-synchronized such that no two signals are sampled during the same clock period. In addition, to reduce the current consumption further, the analog conversion circuits 138, 140, and 142, are put into a low current, or standby, mode when a sampling is not being performed. The sampling block 149 is therefore synchronized to the sampling clock CLK and controls the analog conversion circuits 138, 140, and 142, using, for example, a current pulse CP and voltage pulse VP. The sampling, therefore, corresponds to a clocked, one-bit analog-to-digital conversion.

The sampled current and voltage, CSP and VSP, respectively, are digitally filtered in the filter block 158. Stored versions (CC, DC, CV, and DV) of the sampled digital signals (CSP and VSP) are updated whenever the sampled digital signals (CSP and VSP) transition to new states and remain in these new states for a defined number of samples. The filter block 158 uses the sampling clock CLK to count the number of cycles that the sampled signals are in a new state as outlined, for example, by Table 2. An up/down counting circuit and transition detector, as well known in the art, could be used to implement the filter. The filtered states, CC, DC, CV, and DV, are used in the control block 150 to control the current flow through the switch block 130.

The advantages of the present invention may now be summarized. The present invention provides an effective and very manufacturable method and circuit for measuring and filtering analog signals in a battery protection algorithm. The measuring and filtering method and circuit exhibit reduced current consumption. The current consumption is reduced by generating a sampling clock with a relatively slow period. The current consumption is reduced by de-synchronizing the sampling of analog signals such that no two signals are sampled during the same clock period. Current consumption is also reduced by putting the analog-to-digital sampling circuits into standby mode when not sampling. Cost is reduced by integrating the clock generator on-chip. Tight sampling and filtering error specifications using a relatively slow clock period are achieved by trimming or adjusting the sampling clock period during testing.

As shown in the preferred embodiments, the novel circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A signal processing method for a battery protection algorithm comprising:
   generating a clock signal having a fixed period;
   sampling a plurality of analog signals using a plurality of sampling circuits to create a plurality of sampled digital signals wherein said sampling is synchronized with said clock signal and wherein said analog signals are sampled such that no two said analog signals are sampled during a single said fixed period; and
   filtering said sampled digital signals such that stored versions of said sampled digital signals are updated whenever said sampled digital signals transition to new states and remain in said new states for a defined number of said samplings, wherein said step of generating a clock signal comprises a bias current charging an on-chip capacitor.

2. The method according to claim 1 wherein said fixed period is between about 100 microseconds and about 10 milliseconds.

3. The method according to claim 1 wherein each said sampling circuit operates in a standby, low-current mode when not sampling.

4. The method according to claim 1 wherein said step of sampling comprises a clocked, one-bit analog-to-digital conversion.

5. The method according to claim 1 wherein said analog signals consist of one of the group of: charging voltage, charging current, discharging voltage, and discharging current, and combinations of the above.

6. The method according to claim 1 wherein said battery comprises a lithium ion ($Li^+$) battery.

7. A signal processing method for a battery protection algorithm comprising:
   generating a clock signal having a fixed period of between 100 microseconds and 10 milliseconds;

sampling a plurality of analog signals using a plurality of sampling circuits to create a plurality of sampled digital signals wherein said sampling is synchronized with said clock signal, wherein said analog signal is sampled such that no two said analog signals are sampled during a single said fixed period of said clock signal, and wherein said analog signals consist of one of the group of: charging voltage, charging current, discharging voltage, and discharging current, and combinations of the above; and filtering said sampled digital signals such that stored versions of said sampled digital signals are updated whenever said sampled digital signals transition to new states and remain in said new states for a defined number of samplings, wherein said step of generating a clock signal comprises a bias current charging an on-chip capacitor.

8. The method according to claim 7 wherein each said sampling circuit operates in a standby, low-current mode when not sampling.

9. The method according to claim 7 wherein said step of sampling comprises a clocked, one-bit analog-to-digital conversion.

10. The method according to claim 7 wherein said battery comprises a lithium ion (Li$^+$) battery.

11. A battery protection measurement and filtering circuit comprising:
  a clock signal generator wherein said clock signal has a fixed period;
  a plurality of sampling circuits to sample a plurality of analog signals and to create a plurality of sampled digital signals wherein said sampling is synchronized with said clock signal and wherein said analog signals are sampled such that no two said analog signals are sampled during a single said fixed period of said clock signal; and
  a digital filter to filter said sampled digital signals such that stored versions of said sampled digital signals are updated whenever said sampled digital signals transition to new states and remain in said new states for a defined number of samples, wherein said clock signal generator comprises a bias current charging an on-chip capacitor.

12. The method according to claim 11 wherein said fixed period is between about 100 microseconds and about 10 milliseconds.

13. The method according to claim 11 wherein said fixed period is adjusted during testing of said clock generator.

14. The method according to claim 11 wherein each said sampling circuit operates in a standby, low-current mode when not sampling.

15. The method according to claim 11 wherein each said sampling circuit comprises a clocked, one-bit analog-to-digital conversion.

16. The method according to claim 11 wherein said analog signals consist of one of the group of: charging voltage, charging current, discharging voltage, and discharging current, and combinations of the above.

17. The method according to claim 11 wherein said battery comprises a lithium ion (Li$^+$) battery.

* * * * *